United States Patent
Lin et al.

(10) Patent No.: US 8,390,118 B2
(45) Date of Patent: Mar. 5, 2013

(54) SEMICONDUCTOR PACKAGE HAVING ELECTRICAL CONNECTING STRUCTURES AND FABRICATION METHOD THEREOF

(75) Inventors: Pang-Chun Lin, Taichung (TW); Chun-Yuan Li, Taichung (TW); Fu-Di Tang, Taichung (TW); Chien-Ping Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 305 days.

(21) Appl. No.: 12/859,635

(22) Filed: Aug. 19, 2010

(65) Prior Publication Data

US 2011/0156252 A1    Jun. 30, 2011

(30) Foreign Application Priority Data

Dec. 25, 2009   (TW) .................................. 098144920

(51) Int. Cl.
*H01L 23/48*   (2006.01)
*H01L 23/52*   (2006.01)
(52) U.S. Cl. ........ 257/738; 257/784; 257/786; 257/787; 438/124

(58) Field of Classification Search .................. 257/738, 257/784, 786, 787, E23.024, E21.002; 438/124
See application file for complete search history.

(56) References Cited

U.S. PATENT DOCUMENTS

| | | | | |
|---|---|---|---|---|
| 5,273,938 | A | * | 12/1993 | Lin et al. .................. 438/107 |
| 5,608,267 | A | * | 3/1997 | Mahulikar et al. ............. 257/796 |
| 5,830,800 | A | | 11/1998 | Lin |
| 6,130,115 | A | | 10/2000 | Okumura et al. |
| 6,143,981 | A | | 11/2000 | Glenn |
| 6,198,171 | B1 | | 3/2001 | Huang et al. |
| 6,498,099 | B1 | | 12/2002 | McLellan et al. |

* cited by examiner

*Primary Examiner* — Theresa T Doan
(74) *Attorney, Agent, or Firm* — Edwards Wildman Palmer LLP; Peter F. Corless; Steven M. Jensen

(57) ABSTRACT

A semiconductor package having electrical connecting structures includes: a conductive layer having a die pad and traces surrounding the die pad; a chip; bonding wires; an encapsulant with a plurality of cavities having a depth greater than the thickness of the die pad and traces for embedding the die pad and the traces therein, and the cavities exposing the die pad and the traces; a solder mask layer formed in the cavities and having a plurality of openings for exposing the trace ends and a portion of the die pad; and solder balls formed in the openings and electrically connected to the trace ends. Engaging the solder mask layer with the encapsulant enhances adhesion strength of the solder mask layer so as to prolong the moisture permeation path and enhance package reliability.

9 Claims, 7 Drawing Sheets

SEMICONDUCTOR PACKAGE HAVING ELECTRICAL CONNECTING STRUCTURES AND FABRICATION METHOD THEREOF

CROSS-REFERENCES TO RELATED APPLICATIONS

This application claims under 35 U.S.C. §119(a) the benefit of Taiwanese Application No. 098144920 filed Dec. 25, 2009, the entire contents of which is incorporated herein by reference.

BACKGROUND OF THE INVENTION

1. Field of the Invention

The present invention relates generally to package structures and fabrication methods thereof, and more particularly, to a QFN (Quad Flat Non-leaded) semiconductor package having electrical connecting structures and a fabrication method thereof.

2. Description of Related Art

Conventionally, a lead frame is used as a chip carrier for carrying a chip so as to form a semiconductor package. The lead frame essentially comprises a die pad and a plurality of leads formed at the periphery of the die pad. A chip is adhered to the die pad and electrically connected to the leads through a plurality of bonding wires. The chip, the die pad, the bonding wires and inner sections of the leads are then encapsulated by a packaging resin so as to form a semiconductor package having a lead frame.

Developing high integration and high density package structures has become a goal of semiconductor industries. Carriers for chip scale packages generally comprise lead frames, flexible substrates, rigid substrates and so on. Therein, lead frames are widely used in chip scale packages in electronic products due to their low costs and ease in processing. For example, a QFN (Quad Flat Non-leaded) package is a lead frame based chip scale package, which is characterized in that the leads thereof do not extend out from the package sides, thus reducing the overall package size.

FIG. 1A is a sectional view of a QFN package using a lead frame as a chip carrier as disclosed by U.S. Pat. Nos. 6,143,981, 6,130,115 and 6,198,171. Referring to FIG. 1A, a chip 12 is disposed on a lead frame 10 and electrically connected to leads 11 of the lead frame 10 through bonding wires 13, and an encapsulant 14 is formed to encasuplate the lead frame 10, the chip 12 and the bonding wires 13, wherein the bottom surfaces of the lead frame 10 and the leads 11 are exposed from the encapsulant 14 for mounting and electrically connecting an external device such as a printed circuit board through a solder material (not shown).

However, as shown in FIG. 1B, since the exposed surfaces of the leads 11 are flush with the encapsulant 14, when solder balls are mounted on the leads 11 for electrically connecting an external printed circuit board, solder bridge is likely to be formed between adjacent solder balls, thereby resulting in poor electrical connection between the package and the printed circuit board.

FIGS. 2A to 2D show a method for fabricating a QFN package without a carrier as disclosed by U.S. Pat. Nos. 5,830,800 and 6,498,099.

As shown in FIG. 2A, a plurality of electroplated projections 21 is formed on a copper plate 20 by electroplating.

As shown in FIG. 2B, a chip 22 is mounted on the electroplated projections 21 and electrically connected therewith through gold wires 23. Then, an encapsulant 24 is formed on the copper plate 20 to encapsulate the electroplated projections 21, the chip 22 and the gold wires 23.

As shown in FIGS. 2C and 2D, the copper plate 20 is removed to expose the bottom surfaces of the electroplated projections 21 and the encapsulant 24 such that an antioxidation coating 25 is applied to the bottom surfaces of the electroplated projections 21 and the encapsulant 24, the antioxidation coating 25 partially exposing the electroplated projections 21. Further, solder balls 26 are mounted on the electroplated projections 21.

However, as shown in FIG. 2E, due to different CTEs of the antioxidation coating 25 and the encapsulant 24, delamination is easy to occur to the interface between the antioxidation coating 25 and the encapsulant 24. As such, moisture can easily permeate therebetween and thus causes electrical leakage of the electroplated projections 21, thereby adversely affecting the electrical performance of the package. Further, as shown in FIG. 2C, since the surfaces of the electroplated projections 21 are flush with the surface of the encapsulant 24, the surfaces of the electroplated projections 21 can easily be scratched during the fabrication process. Furthermore, a soldering process or thermal cycling in practical applications may cause permeation of solder material into the interface between the antioxidation coating 25 and the encapsulant 24, thus resulting in electrical leakage and even short circuit at the interface.

In addition, if the electroplated projections 21 are located far away from the chip 22, long gold wires 23 are required, which accordingly increases the fabrication cost.

Therefore, it is imperative to overcome the above drawbacks of the prior art.

SUMMARY OF THE INVENTION

In view of the above drawbacks of the prior art, the present invention provides a semiconductor package having electrical connecting structures, which comprises: a conductive layer having a die pad and a plurality of traces disposed at the periphery of the die pad, wherein the traces each comprise a trace body, a finger pad formed at one end of the trace body and positioned proximate to the die pad, and a trace end formed at the other end of the trace body and opposite to the finger pad; a chip mounted on the die pad; a plurality of bonding wires electrically connecting the chip and the finger pads; an encapsulant encapsulating the chip and the bonding wires, wherein the encapsulant has a plurality of cavities with a depth greater than a thickness of the die pad and the traces of the conductive layer for embedding the die pad and the traces therein, the cavities allowing the surfaces of the die pad and the traces to be exposed from the encapsulant via the cavities; a solder mask layer formed on the exposed surface of the conductive layer and a bottom surface of the encapsulant and having a plurality of openings formed therein for exposing the trace ends; and a plurality of solder balls formed in the openings of the solder mask layer so as to electrically connect to the trace ends, respectively.

In the above semiconductor package, the difference between the depth of the cavities and the thickness of the die pad and the traces of the conductive layer can be in the range of from 2 to 30 micrometers. Further, the finger pads can extend towards the die pad so as to reduce the length of the bonding wires, thereby reducing the packaging cost.

The present invention further provides a fabrication method of a semiconductor package having electrical connecting structures, which comprises: providing a metal board with a plurality of substrate units; forming a patterned metal layer on the substrate units; forming a conductive layer on the metal layer, wherein the conductive layer has a die pad and a plurality of traces disposed at the periphery of the die pad, the traces each comprising a trace body, a finger pad formed at one end of the trace body and positioned proximate to the die pad, and a trace end formed at the other end of the trace body and opposite to the finger pad; mounting a chip on the die pad and electrically connecting the chip to the finger pads through bonding wires; forming an encapsulant to cover the chip, the bonding wires and the conductive layer; removing the metal board and the metal layer so as to expose at least a portion of a surface of the conductive layer, wherein the encapsulant has a plurality of cavities with a depth greater than the thickness of the die pad and the traces of the conductive layer for embedding the die pad and the traces therein; forming a solder mask layer on the exposed at least a portion of the surface of the conductive layer and a bottom surface of the encapsulant, and forming a plurality of openings in the solder mask layer to expose the trace ends; forming a plurality of solder balls in the openings of the solder mask layer, respectively; and singulating the substrate units from each other so as to obtain a plurality of semiconductor packages.

In the above fabrication method, the metal board can be made of copper; the metal layer can be made of one or more materials selected from the group consisting of Ni, Sn and Pb; and the metal layer can have a thickness between 2 and 30 micrometers.

The fabrication method of the metal layer and the conductive layer can comprise: forming a resist layer on the metal board and forming a plurality of openings in the resist layer to expose a portion of the metal board; forming the metal layer on the metal board in the openings of the resist layer; forming the conductive layer on the metal layer in the openings of the resist layer; and removing the resist layer to expose the metal board and the metal layer and the conductive layer on the metal board.

In the above-described semiconductor package and fabrication method thereof, the size of the trace ends can be greater than that of the openings of the solder mask layer. The trace ends can be, but not limited to, of an elliptical shape, a circular shape or a cruciform shape. The conductive layer can be made of one or more materials selected from the group consisting of Au, Pd and Ni. The conductive layer can further comprise power pads and ground pads electrically connecting to the bonding wires.

In an embodiment, the trace ends can be partially exposed from the openings of the solder mask layer, respectively, and a portion of the encapsulant can be exposed from the openings of the solder mask layer. Further, a portion of the surface of the die pad can be exposed from the openings of the solder mask layer.

The present invention further provides another semiconductor package having electrical connecting structures, which comprises: a conductive layer with a plurality of traces, each of the traces having a trace body, a contact pad formed at one end of the trace body and positioned proximate to a chip, and a trace end formed at the other end of the trace body and positioned distal to the chip; the chip flip-chip connected to the contact pads; an encapsulant encapsulating the chip and the conductive layer, wherein the encapsulant has a plurality of cavities with a depth greater than the thickness of the conductive layer for embedding the conductive layer therein, the cavities allowing at least a portion of the surface of the conductive layer to be exposed therefrom; a solder mask layer formed on the exposed surface of the conductive layer and a bottom surface of the encapsulant and having a plurality of openings for exposing the trace ends; and a plurality of solder balls formed in the openings of the solder mask layer so as to electrically connect to the trace ends, respectively.

In the semiconductor package, the difference between the depth of the cavities and the thickness of the conductive layer is in the range of 2 and 30 micrometers.

The present invention further provides a fabrication method of a semiconductor package having electrical connecting structures, which comprises: providing a metal board with a plurality of substrate units; forming a patterned metal layer on the substrate units; forming a conductive layer on the metal layer, wherein the conductive layer has a plurality of traces each comprising a trace body, a contact pad positioned proximate to one end of the trace body, and a trace end formed at the other end of the trace body and opposite to the contact pad; mounting a chip in a flip-chip manner so as to electrically connect the chip to the contact pads; forming an encapsulant to cover the chip and the conductive layer; removing the metal board and the metal layer so as to expose the conductive layer, wherein the encapsulant has a plurality of cavities with a depth greater than the thickness of the conductive layer for embedding the traces of the conductive layer therein; forming a solder mask layer on the exposed surface of the conductive layer and the bottom surface of the encapsulant, and forming a plurality of openings in the solder mask layer to expose the trace ends; forming a plurality of solder balls in the openings of the solder mask layer, respectively; and singulating the substrate units from each other so as to obtain a plurality of semiconductor packages.

In the above fabrication method, the metal board can be made of copper; the metal layer can be made of one or more materials selected from the group consisting of Ni, Sn and Pb; and the metal layer can have a thickness between 2 and 30 micrometers.

The fabrication method of the metal layer and the conductive layer comprises: forming a resist layer on the metal board and forming a plurality of openings in the resist layer to expose a portion of the metal board; forming the metal layer on the metal board in the openings of the resist layer; forming the conductive layer on the metal layer in the openings of the resist layer; and removing the resist layer to expose the metal board and the metal layer and the conductive layer on the metal board.

In the above semiconductor package and fabrication method thereof, the conductive layer can be made of one or more materials selected from the group consisting of Au, Pd and Ni; the size of the trace ends can be greater than that of the openings of the solder mask layer; the trace ends can have an elliptical shape, a circular shape or a cruciform shape; the trace ends can be partially exposed from the openings of the solder mask layer, respectively, and a portion of the encapsulant can be exposed from the openings of the solder mask layer.

According to the present invention, the traces extend towards the die pad so as to reduce the length of the bonding wires. Since the cavities of the encapsulant have a depth greater than the thickness of the die pad and the traces of the conductive layer, the solder mask layer and the encapsulant can be engaged with each other for enhancing the adhesion strength of the solder mask layer. Meanwhile, the solder mask layer can prevent solder bridging from occurring during a thermal process. Further, the cavities of the encapsulant having a depth greater than the thickness of the die pad and the traces of the conductive layer allow the die pad and the traces to be embedded therein, thereby protecting the conductive layer from scratching. Furthermore, the bonding between the solder mask layer and the encapsulant as well as the conductive layer in such as a horizontal direction and a vertical direction, prolong the permeation path of solder material or moisture into the package. As such, electrical leakage caused by delamination of the solder mask layer, moisture permeating into the package, and short circuit caused by permeation of solder material in the prior art, can be prevented.

BRIEF DESCRIPTION OF DRAWINGS

FIG. 3D is a sectional view of FIG. 3D' along a dashed line AA therein, FIG. 3G' is a partially enlarged view of FIG. 3G, FIG. 3H' is a partially enlarged bottom view of FIG. 3H, and FIG. 3H" is a sectional view of FIG. 3H' along a dashed line AA therein;

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that terms referring to relativity, such as "top" and "bottom", used in the disclosure are intended to describe relative connecting relationship of components in a semiconductor package but are not intended to limit the scope of the present invention.

FIGS. 3A to 3H show a fabrication method of a semiconductor package having electrical connecting structures according to an embodiment of the present invention.

Figure 1A:
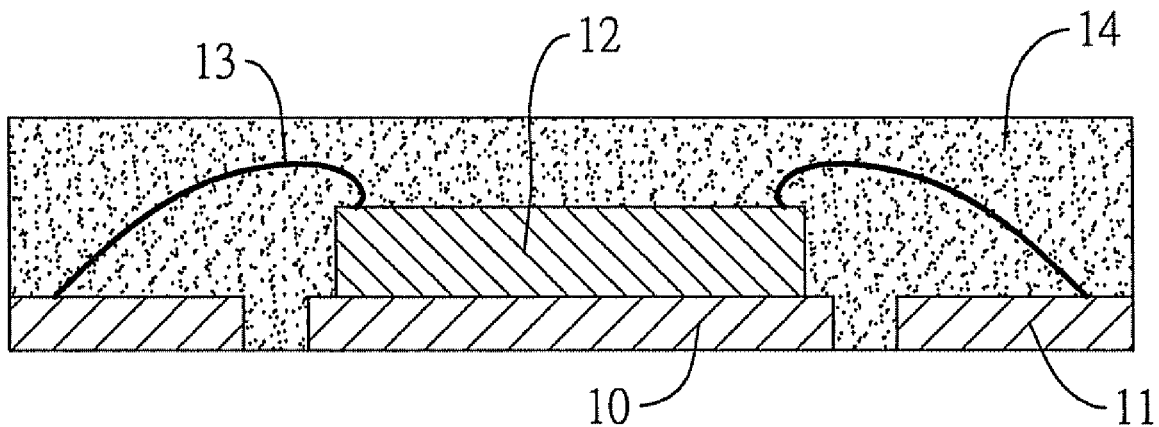
FIGS. 1A and 1B are sectional views showing a conventional QFN package using a lead frame as a chip carrier.
Figure 1B:
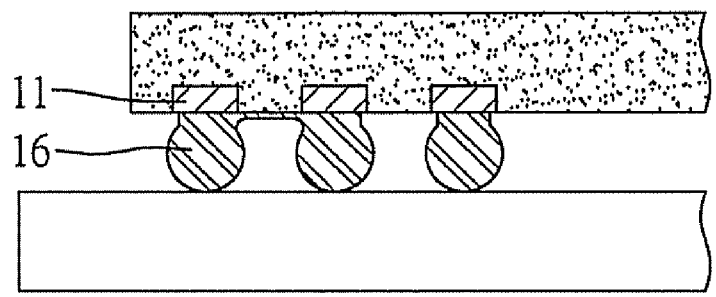
Figure 2A:
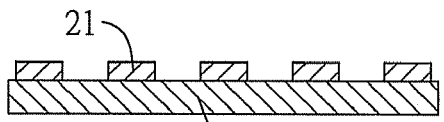
FIGS. 2A to 2E are sectional views showing a conventional fabrication method of a QFN package without a carrier as disclosed by U.S. Pat. Nos. 5,830,800 and 6,498,099.
Figure 2B:
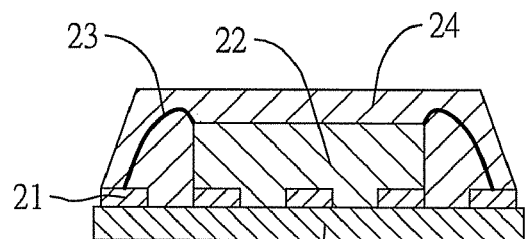
Figure 2C:
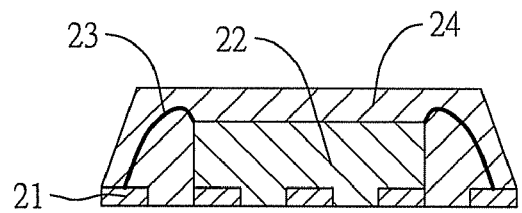
Figure 2D:
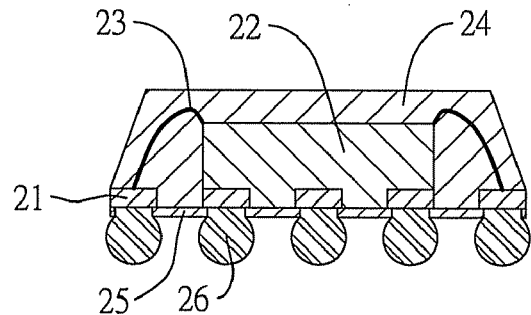
Figure 2E:
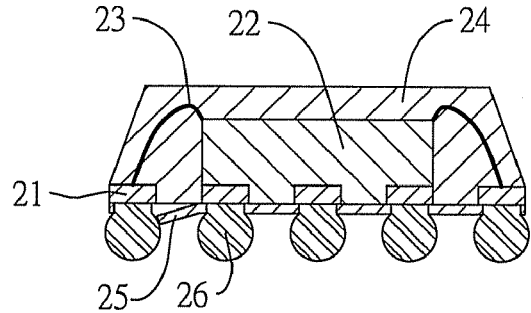
Figure 3A:
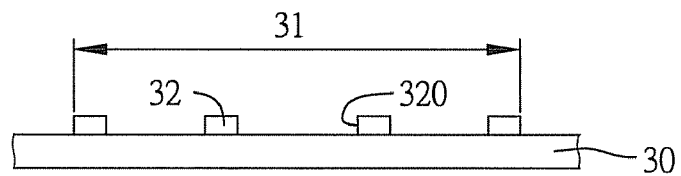
FIGS. 3A to 3H show a fabrication method of a semiconductor package having electrical connecting structures according to an embodiment of the present invention, wherein FIG. 3D' is a top view.

As shown in FIG. 3A, a metal board 30 with a plurality of substrate units 31 is provided. A resist layer 32 is formed on the metal board 30. A plurality of openings 320 are formed in the resist layer 32 to expose a portion of the metal board 30. In the present embodiment, the metal board 30 is made of copper.

Figure 3B:
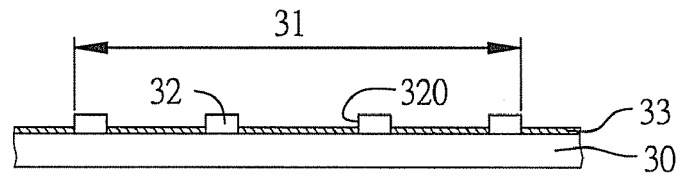

As shown in FIG. 3B, a metal layer 33 is formed on the exposed portion of the metal board 30 by electroplating, for example. The metal layer 33 can be made of copper, or made of one or more materials selected from the group consisting of Ni, Sn and Pb. The metal layer 33 can also be made of an alloy, for example, a binary or ternary alloy. The metal layer 33 is used for providing deeper cavities in an encapsulant to be formed later. Preferably, the metal layer 33 is of a thickness between 2 to 30 micrometers.

Figure 3C:
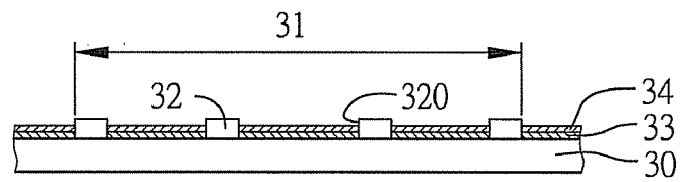

As shown in FIG. 3C, a conductive layer 34 is formed on the metal layer 33 in the openings 320 of the resist layer 32. The conductive layer 34 can be made of one or more materials selected from the group consisting of Au, Pd and Ni. For example, the conductive layer 34 can be comprised of Au/Pd/Ni/Pd layers in sequence or vice versa.

Figure 3D:
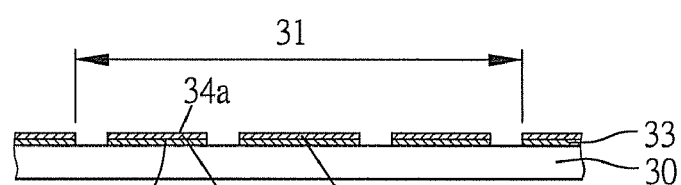
Figure 3D:
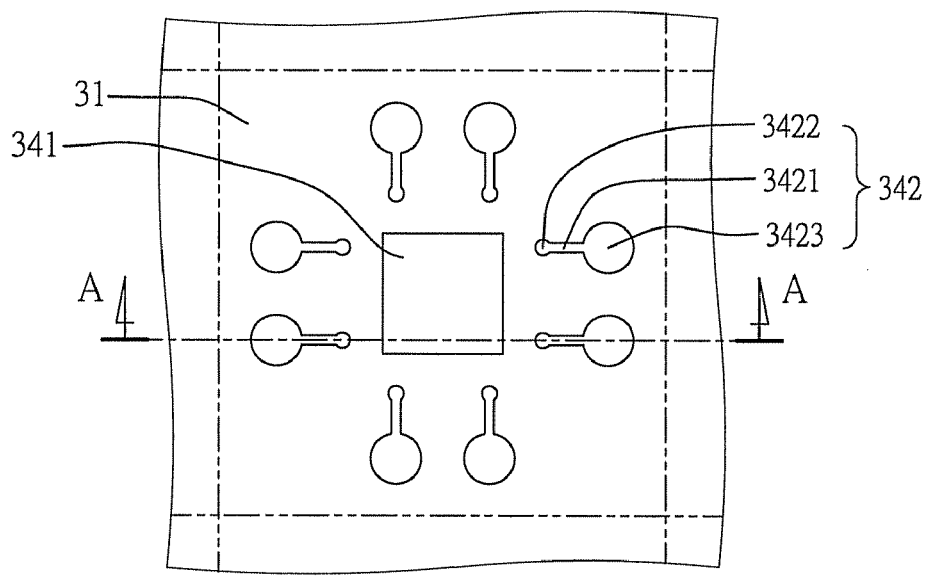

As shown in FIGS. 3D and 3D', wherein FIG. 3D' is a top view and FIG. 3D is a sectional view of FIG. 3D' along a dashed line AA therein, the resist layer 32 is removed to expose the metal board 30 and the metal layer 33 and the conductive layer 34 on the metal board 30. Therein, the conductive layer 34 is so formed to have a die pad 341 and a plurality of traces 342 disposed at the periphery of the die pad 341. In particular, the traces 342 each comprise a trace body 3421, a finger pad 3422 formed at one end of the trace body and positioned proximate to the die pad 341, and a trace end 3423 formed at the other end of the trace body and positioned distal to the die pad 341. The conductive layer 34 has a top surface 34a and an opposing bottom surface 34b. Likewise, the traces 342 each have the top surface 34a and the opposing bottom surface 34b.

Figure 3E:
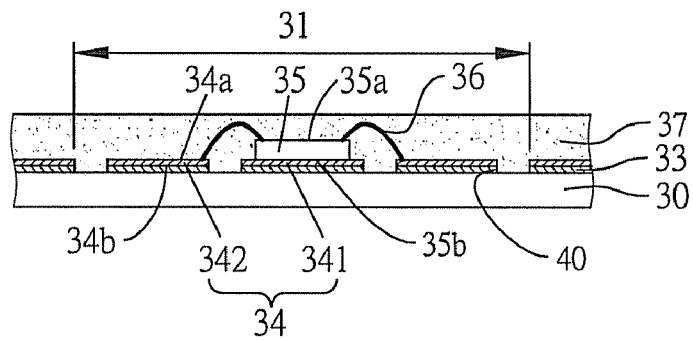

As shown in FIG. 3E, a chip 35 is mounted on the die pad 341, and the chip 35 has an active surface 35a and an opposing inactive surface 35b. The chip 35 is mounted on the die pad 341 via the inactive surface 35b. A plurality of signal pads, power pads, and ground pads are provided on the active surface 35a of the chip 35 and electrically connected to the top surfaces 34a of the finger pads 3422 through a plurality of bonding wires 36. Then, an encapsulant 37 is formed to cover the chip 35, the bonding wires 36 and the conductive layer 34. The finger pads 3422 extend towards the die pad 341 so as to reduce the length of the bonding wires 36, thereby reducing the cost.

Figure 3F:
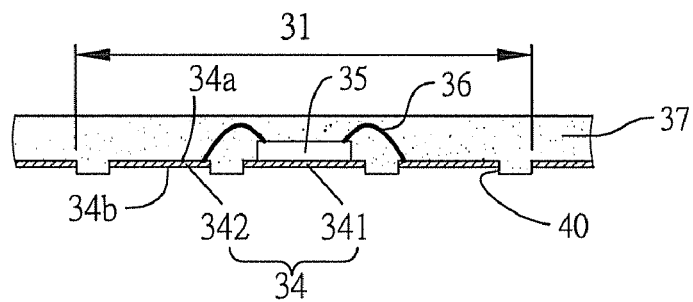

As shown in FIG. 3F, the metal board 30 and the metal layer 33 are removed by etching, for example, so as to expose the conductive layer 34, and in consequence a plurality of cavities 40 accommodating both the die pad 341 and the traces 342 are formed in the encapsulant 37. The cavities 40 thus formed are of a depth greater than the thickness of the die pad 341 and the traces 342 of the conductive layer 34. As shown in the drawing, a portion of the encapsulant 37 protrudes between the conductive layer 34 and thus exposed, and the exposed portion of the encapsulant 37 protrudes above the conductive layer 34. In another embodiment, the etching process is much easier to control if the metal layer 33 is made of a material other than copper.

Figure 3G:
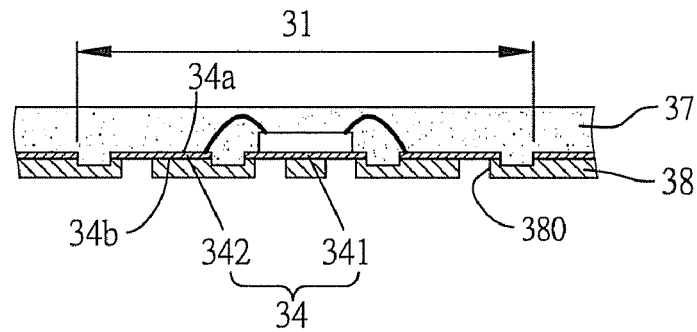
Figure 3G:
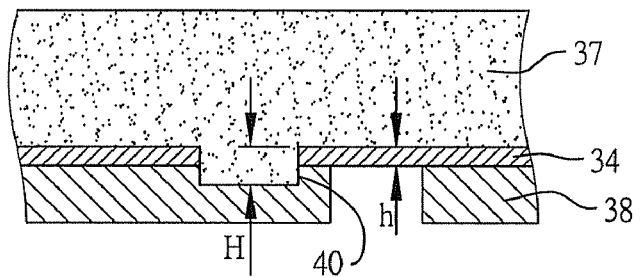

As shown in FIG. 3G, a solder mask layer 38 is formed on the exposed portion of the encapsulant 37 and the conductive layer 34 exposed from the encapsulant 37, and a plurality of openings 380 is formed in the solder mask layer 38 to expose the trace ends 3423 and at least a portion of the die pad 341.

As shown in FIG. 3G', which is a partially enlarged view of FIG. 3G, the depth H of the cavities 40 is greater than the thickness h of the conductive layer 34. In particular, the difference between the depth H of the cavities 40 and the thickness h of the die pad 341 and the traces 342 of the conductive layer 34 is between 2 and 30 micrometers. The bonding between the solder mask layer 38 and the encapsulant 37 as well as the conductive layer 34 prolongs the permeation path of solder material or moisture into the package. As such, electrical leakage caused by delamination of the solder mask layer, moisture permeating into the package, and short circuit caused by solder permeation in the prior art can be prevented.

Figure 3H:
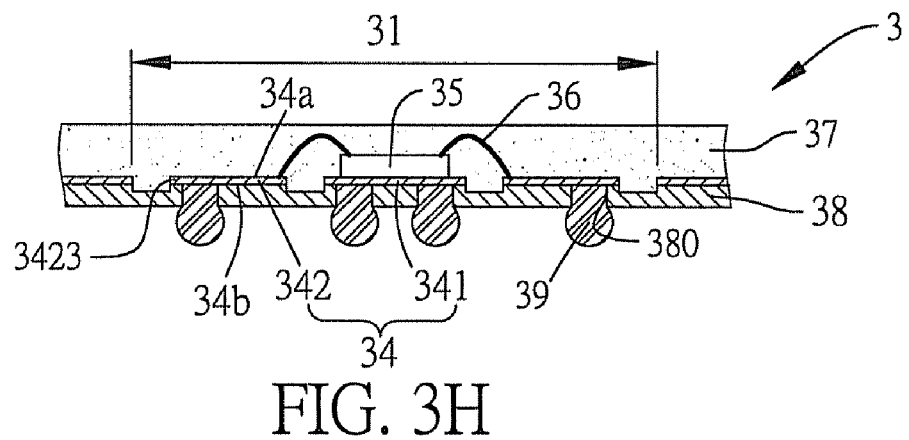
Figure 3H:
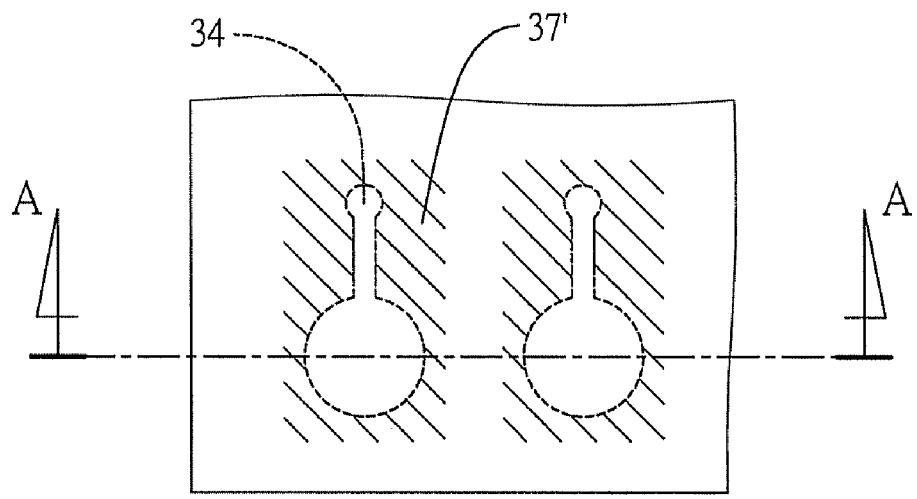
Figure 3H:
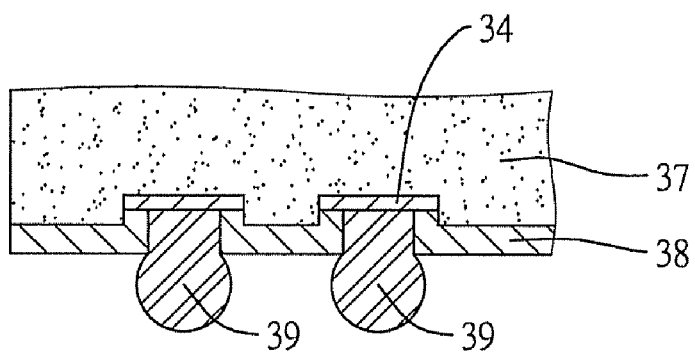

As shown in FIG. 3H, a plurality of solder balls 39 are each formed in a corresponding one of the openings 380 of the solder mask layer 38, and the substrate units 31 are singulated from each other by cutting the encapsulant 37, the conductive layer 34, and the solder mask layer 38 along the borders of the substrate units 31 so as to obtain a plurality of semiconductor packages 3. As shown in the drawing, the openings 380 of the solder mask layer 38 expose the bottom surfaces of the trace ends 3423 and at least a portion of the die pad 341. The solder balls 39 are received in the openings 380 of the solder mask layer 38 so as to prevent solder bridging from occurring to the solder balls 39 in the course of electrical connection during a thermal process.

Referring to FIGS. 3H' and 3H", with the exposed portion of the encapsulant 37' (as denoted by the hatched area shown in FIG. 3H') protruding above the conductive layer 34, permeation, if any, of solder material and moisture into the package is stopped by the exposed portion of the encapsulant 37', thereby efficiently preventing electrical leakage and short circuits. Furthermore, the bonding between the solder mask layer 38 and the conductive layer 34 prolongs the permeation path of moisture and/or solder material.

In addition, with the conductive layer 34 being engaged with the encapsulant 37, the conductive layer 34 is unlikely to be scratched inadvertently during the fabrication process, which accordingly improves the soldering effect between the solder balls 39 and the conductive layer 34.

Figures 1, 4:
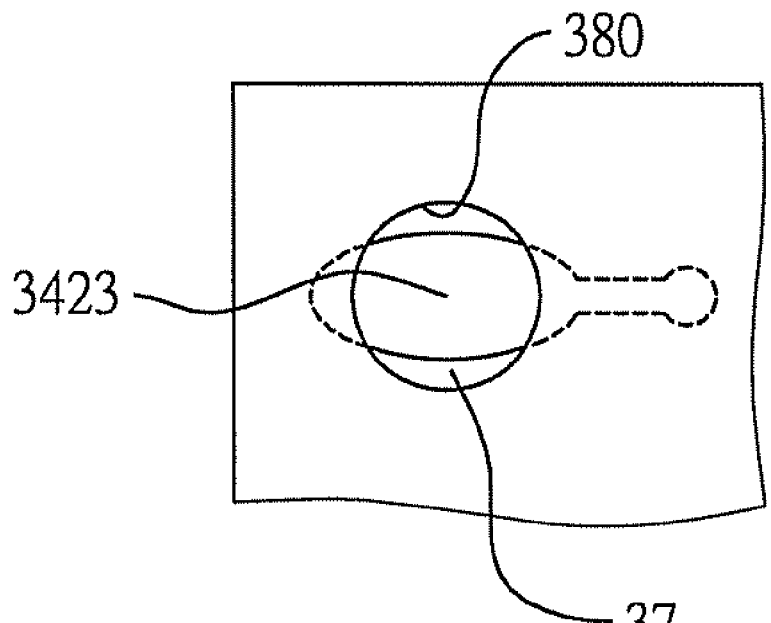
FIGS. 4-1 and 4-2 are bottom views showing different embodiment of trace ends and openings of a solder mask layer.
Figures 2, 4:
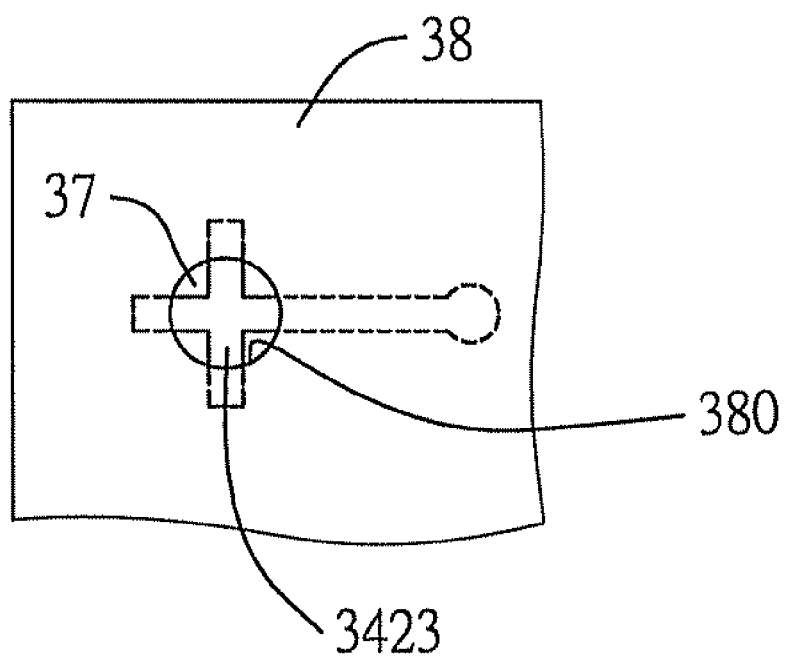

Referring to FIGS. 4-1 and 4-2, there are shown bottom views of different embodiment of the trace ends 3423 and the openings 380 of the solder mask layer 38.

Preferably, the size of each of the trace ends 3423 is larger than that of each of the openings 380 of the solder mask layer 38. To be more specific, the area of each of the trace ends 3423 shown in the bottom views of FIGS. 4-1 and 4-2 is greater than that of each of the openings 380. Further, the trace ends 3423 are of an elliptical shape, a circular shape, or a cruciform shape. The alteration of the shape of the trace ends 3423 is carried out during the process step of forming the conductive layer 34 but is not described herein.

Referring to FIGS. 4-1 and 4-2, the trace ends 3423 are partially exposed from the openings 380, respectively. That is, each of the trace ends 3423 is partially covered by the solder mask layer 38. As such, the bonding strength between the trace ends 3423 and the encapsulant 37 is enhanced to thereby prevent detachment of the trace ends 3423 from the encapsulant 37.

The present invention further provides a semiconductor package having electrical connecting structures, which comprises: a conductive layer 34 having a top surface 34a and an opposing bottom surface 34b, wherein the conductive layer 34 has a die pad 341 and a plurality of traces 342 disposed at the periphery of the die pad 341, the traces 342 each comprise a trace body 3421, a finger pad 3422 formed at one end of the trace body 3421 and positioned proximate to the die pad 341, and a trace end 3423 formed at the other end of the trace body 3421 and positioned distal to the die pad 341; a chip 35 mounted on the top surface 34a of the die pad 341, wherein the chip 35 has an active surface 35a and an opposing inactive surface 35b, the chip 35 is mounted on the die pad 341 via the inactive surface 35b thereof, and the active surface 35a has a plurality of signal pads, power pads and ground pads; a plurality of bonding wires 36 electrically connecting the signal pads, power pads and ground pads of the chip 35 to the top surfaces 34a of the finger pads 3422; an encapsulant 37 for encapsulating the chip 35 and the bonding wires 36, wherein the encapsulant 37 has a plurality of cavities 40 with a depth greater than the thickness of the die pad 341 and the traces 342 of the conductive layer 34 for embedding the die pad 341 and the traces 342 therein, the cavities 40 allowing the bottom surfaces 34b of the die pad 341 and the traces 342 to be exposed therefrom; a solder mask layer 38 formed on the exposed bottom surface 34b of the conductive layer 34 and a bottom surface of the encapsulant 37 and having a plurality of openings 380 formed therein for exposing the bottom surfaces of the trace ends 3423 and a portion of the die pad 341; and a plurality of solder balls 39 formed in the openings 380 of the solder mask layer 38 so as to electrically connect to the bottom surfaces 34b of the trace ends 3423 and portion of the die pad 341.

Therein, the conductive layer 34 can be made of one or more materials selected from the group consisting of Au, Pd and Ni. For example, the conductive layer 34 can be comprised of Au/Pd/Ni/Pd layers in sequence or vice versa.

Preferably, the size of each of the trace ends 3423 is larger than that of each of the openings 380 of the solder mask layer. In addition, the trace ends 3423 are of an elliptic shape, a circular shape, or a cruciform shape.

Referring to FIGS. 4-1 and 4-2, the trace ends 3423 are partially exposed from the openings 380, respectively. That is, each of the trace ends 3423 is partially covered by the solder mask layer 38. As such, the bonding strength between the trace ends 3423 and the encapsulant 37 is enhanced, which thus prevents detachment of the trace ends 3423 from the encapsulant 37.

Figure 5:
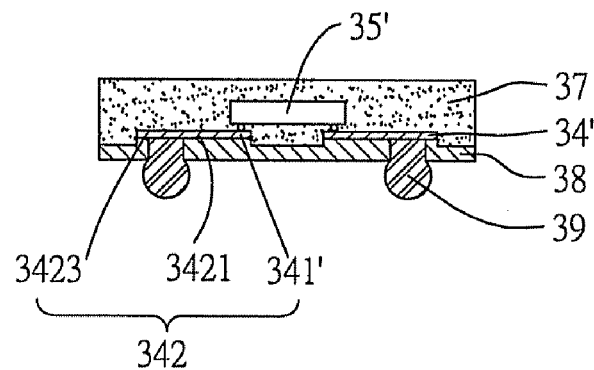
FIG. 5 is a sectional view showing a semiconductor package having electrical connecting structures according to another embodiment of the present invention.

FIG. 5 shows a semiconductor package having electrical connecting structures according to another embodiment of the present invention. The present embodiment differs from the above-described embodiment in that, in the present embodiment, a chip 35' is flip-chip mounted to a conductive layer 34'.

The conductive layer 34' has a plurality of traces 342 each comprising a trace body 3421, a contact pad 341' formed at one end of the trace body 3421 and positioned proximate to the chip 35', and a trace end 3423 formed at the other end of the trace body 3421 and positioned distal to the chip 35'. The chip 35' is mounted on the contact pads 341'.

Figure 6:
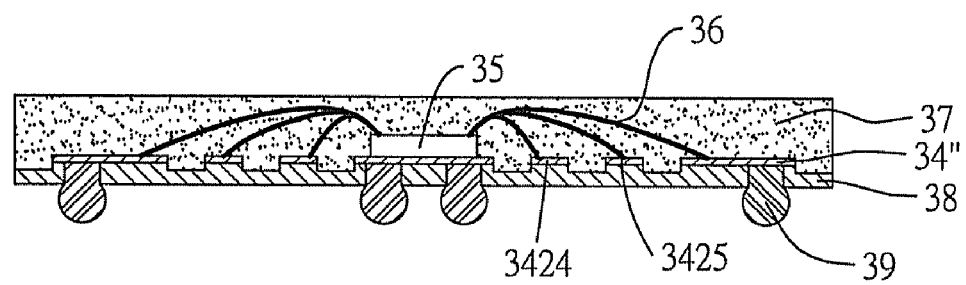
FIG. 6 is a sectional view showing a semiconductor package having electrical connecting structures according to a further embodiment of the present invention.

FIG. 6 shows a semiconductor package having electrically connecting structures according to another embodiment of the present invention. The only difference between FIG. 6 and FIG. 3H is that, as shown in FIG. 6, a conductive layer 34" in the present embodiment is further provided with power pads 3424 and ground pads 3425 such that the power pads 3424 and the ground pads 3425 are electrically connected to the bonding wires 36, respectively. Further, the power pads 3424 and the ground pads 3425 are ring-shaped.

Therefore, the present invention forms a metal layer and a corresponding conductive layer on a metal board, mounts a chip on a die pad of each of the substrate units, forms an encapsulant for encapsulating the structure, removes the metal board and the metal layer to expose the conductive layer, forms a solder mask layer on the encapsulant and the conductive layer, and forms a plurality of openings in the solder mask layer to expose the bottom surfaces of the trace ends and a portion of the die pad so as to embed the conductive layer in the encapsulant and cover the conductive layer with the solder mask layer, and finally forms a plurality of solder balls in the openings of the solder mask layer to be electrically connected to the bottom surfaces of the traces and portion of the die pad, thereby preventing soldering bridging from occurring to the solder balls in the course of electrical connection during a thermal process. Further, since the encapsulant has cavities formed after the metal layer is removed, a portion of the solder mask layer can be embedded in the cavities so as to enhance the adhesion strength of the solder mask layer and prolong the permeation path of moisture into the package, thereby preventing electrical leakage caused by delamination of the solder mask layer, moisture permeating into the package, and short circuit caused by permeation of solder material in the prior art.

Furthermore, since the conductive layer is engaged with the encapsulant, the conductive layer is protected from scratching during the fabrication process, thereby improving the soldering effect between the solder balls and the conductive layer. Moreover, the finger pads extending towards the die pad reduce the length of bonding wires and thereby reduce the cost.

The above descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package having electrical connecting structures, comprising:
    a conductive layer having a die pad and a plurality of traces disposed at a periphery of the die pad, wherein the traces each comprise a trace body, a finger pad formed at an end of the trace body and positioned proximate to the die pad, and a trace end formed at another other end of the trace body and positioned distal to the die pad;
    a chip mounted on the die pad;
    a plurality of bonding wires for electrically connecting the chip and the finger pads;
    an encapsulant for encapsulating the chip and the bonding wires, wherein the encapsulant has a plurality of cavities for embedding the die pad and the traces of the conductive layer therein, the cavities being of a depth greater than a thickness of the conductive layer and allowing at least a portion of surfaces of the die pad and the traces of the conductive layer to be exposed therefrom;
    a solder mask layer formed on the at least a portion of surfaces of the die pad and traces of the conductive layer and a bottom surface of the encapsulant and having a plurality of openings formed therein for exposing the trace ends; and
    a plurality of solder balls formed in the openings of the solder mask layer so as to be electrically connected to the trace ends, respectively.

2. The package of claim 1, wherein the conductive layer is made of one or more materials selected from the group consisting of Au, Pd and Ni.

3. The package of claim 1, wherein the trace ends are of a size larger than the openings of the solder mask layer.

4. The package of claim 1, wherein the trace ends are of an elliptical shape, a circular shape, or a cruciform shape.

5. The package of claim 1, wherein the trace ends are partially exposed from the openings of the solder mask layer, respectively.

6. The package of claim 5, wherein a portion of the encapsulant is exposed from the openings of the solder mask layer.

7. The package of claim 1, wherein a portion of the surface of the die pad is further exposed from the openings of the solder mask layer, such that the die pad is capable of being electrically connected with the solder balls via the openings.

8. The package of claim 1, wherein a difference between the depth of the cavities and the thickness of the conductive layer is between 2 and 30 micrometers.

9. The package of claim 1, wherein the conductive layer is further provided with power pads and ground pads such that the power pads and the ground pads are electrically connected to the bonding wires.

* * * * *